United States Patent [19]
Cao et al.

[11] Patent Number: 5,541,534
[45] Date of Patent: Jul. 30, 1996

[54] MIXED VOLTAGE INTERFACE CONVERTER

[75] Inventors: Tai Cao; Satyajit Dutta; Thai Q. Nguyen; Thanh D. Trinh; Lloyd A. Walls, all of Austin, Tex.

[73] Assignee: International Business Machines Corporation, Armonk, N.Y.

[21] Appl. No.: 387,517

[22] Filed: Feb. 13, 1995

[51] Int. Cl.[6] .................. H03K 19/0185; H03K 19/0948
[52] U.S. Cl. .................. 326/81; 326/68; 326/83
[58] Field of Search .................. 326/68, 80–81, 326/83, 86, 21, 121

[56] References Cited

U.S. PATENT DOCUMENTS

| | | |
|---|---|---|
| 4,314,166 | 2/1982 | Bismark . |
| 4,965,459 | 10/1990 | Murray . |
| 5,276,364 | 1/1994 | Wellheuser . |
| 5,300,835 | 4/1994 | Assar et al. . |
| 5,311,083 | 5/1994 | Wanlass ................. 326/68 |
| 5,352,942 | 10/1994 | Tanaka et al. ................. 326/68 |
| 5,378,945 | 1/1995 | Partovi ................. 326/68 |
| 5,406,140 | 4/1995 | Wert et al. ................. 326/81 |

*Primary Examiner*—Edward P. Westin
*Assistant Examiner*—Jon Santamauro
*Attorney, Agent, or Firm*—Kelly K. Kordzik; Winstead Sechrest & Minick P.C.; Mark E. McBurney

[57] ABSTRACT

The present invention facilitates communication of signals from circuitry implemented with a first CMOS technology requiring a first voltage level supply for operation to circuitry implemented with a second CMOS technology requiring a second voltage level supply for operation, wherein the first and second voltage level supplies are not equal. The present invention receives from the circuitry implemented with a first CMOS technology a signal which has a first voltage level that is not acceptable for input into the circuitry implemented with a second CMOS technology. This signal is converted to a second voltage level that is acceptable for input into the circuitry implemented with a second CMOS technology, and then transmitted to the circuitry implemented with a second CMOS technology requiring a second voltage level supply for operation.

3 Claims, 2 Drawing Sheets

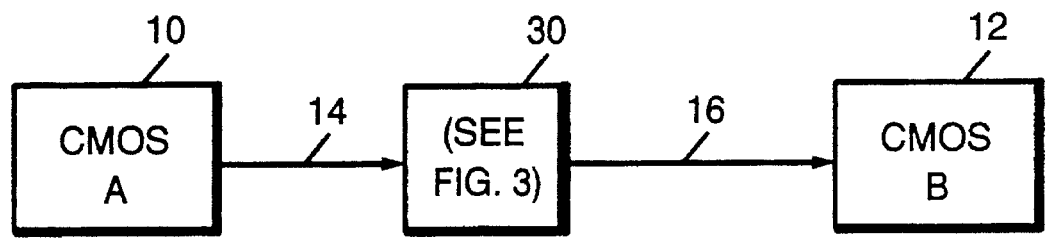
FIG. 1
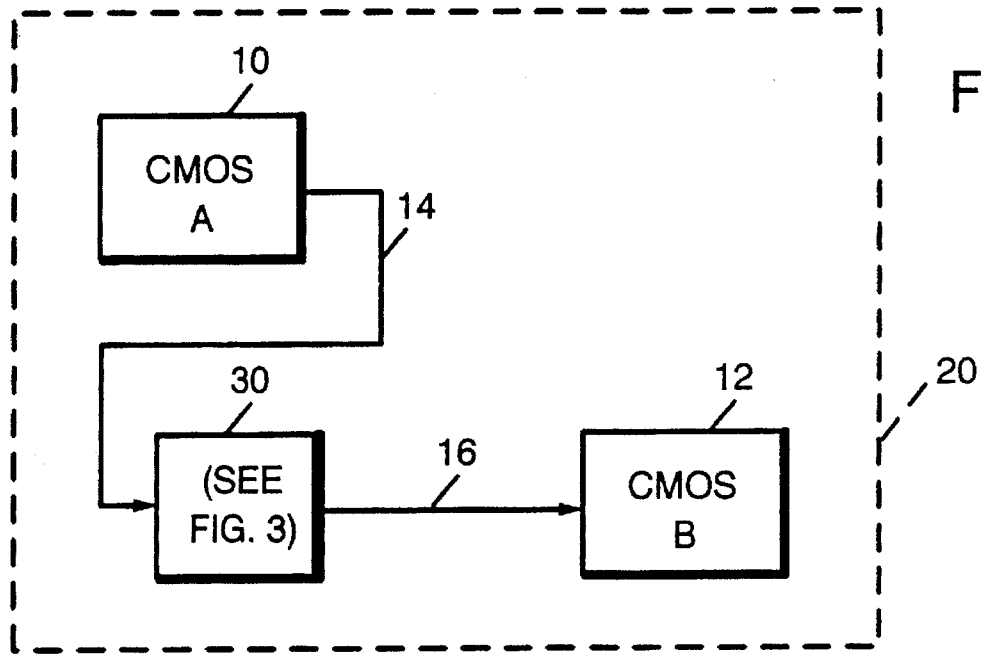
FIG. 2
FIG. 4
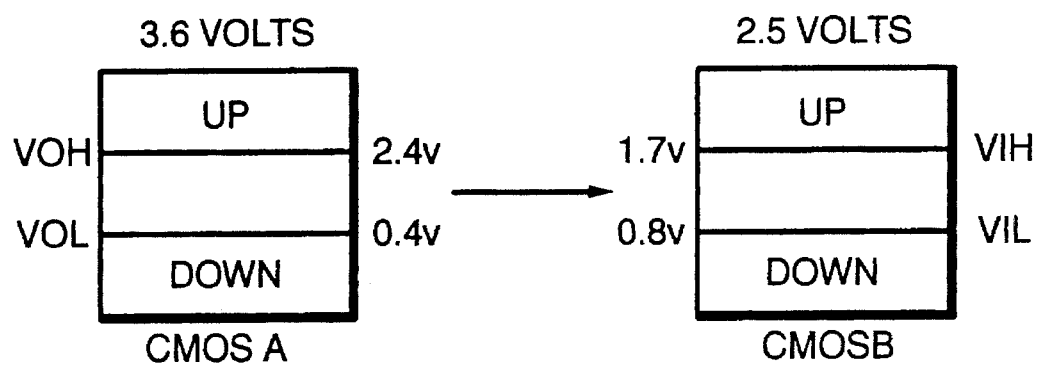

MIXED VOLTAGE INTERFACE CONVERTER

TECHNICAL FIELD OF THE INVENTION

The present invention relates in general to voltage converters, and in particular, to a circuit for converting signals between different CMOS technology circuits.

BACKGROUND OF THE INVENTION

Metal-oxide semiconductor ("MOS") technology is now preferred in the manufacturing of many semiconductor devices and circuits. Complementary MOS ("CMOS") circuitry is often a preferred technology for implementation of integrated circuits because of associated small levels of power dissipation.

CMOS technology advances have been characterized by a scaling of the power supply voltage required to activate the CMOS circuitry. Various CMOS technologies require 5 volt, 3.6 volt, and 2.5 volt power supplies. A potential for "punch through" exists if too high of a voltage is applied to the thin oxide gate associated with mixed technologies. The problem arises when there is a situation where a system design utilizes a mix of these technologies thus requiring different power supply voltages. As a result of such a situation, the output signals from one technology are not directly compatible with the input signal requirements of another CMOS technology. Therefore, if the system requires that a signal be communicated from a first circuit implemented in one CMOS technology of a higher voltage than a second circuit implemented in a different CMOS technology of a lower voltage, it is likely that a significant portion of this communication will be lost, degrading or destroying the reliability of the system.

Thus, there is a need in the art for a technique to convert signal levels communicated between circuits implemented in different CMOS technologies so that the circuits are compatible.

SUMMARY OF THE INVENTION

The aforementioned need is satisfied by the present invention, which utilizes a technique for facilitating communication of signals from circuitry implemented with a first CMOS technology requiring a first voltage level supply for operation to circuitry implemented with a second CMOS technology requiring a second and different voltage level supply for operation (e.g., from a higher voltage to a lower voltage). A preferred embodiment of the present invention receives from the circuitry implemented with the first CMOS technology a signal which has a first voltage level that is not acceptable for input into the circuitry implemented with the second CMOS technology. The first voltage level of the received signal is then converted to a second voltage level that is acceptable for input into the circuitry implemented with the second CMOS technology. This second voltage level that is acceptable for input into the circuitry implemented with the second CMOS technology is transmitted to the circuitry implemented with the second CMOS technology.

To implement the above technique, the present invention, in a preferred embodiment, implements a circuit comprising a first N-type FET placed in a series coupling with the incoming signal, wherein this FET is also coupled to a receiver amplifier at the output of the circuit. If a "low" signal is received, the FET device essentially passes the low signal through to the receiver for output to the circuit implemented with a second CMOS technology. However, if a "high" signal is received, the series FET device outputs a signal, which is input into a differential receiver which has its positive input tied to a reference voltage. This reference voltage is set so that it will produce a "low" signal to thus turn on a second FET device, which is coupled between a power supply voltage and the input to the aforementioned differential receiver. As a result, this second FET device will produce a voltage level to the receiver which is well within the operating parameters of the circuitry implemented with a second CMOS technology.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which:

FIG. 1 illustrates a multi-chip system design utilizing a preferred embodiment of the present invention;

FIG. 2 illustrates a single-chip system design implementing a preferred embodiment of the present invention;

FIG. 4 illustrates the problem existing between different CMOS technologies.

DETAILED DESCRIPTION OF A PREFERRED EMBODIMENT OF THE INVENTION

Figure 3:
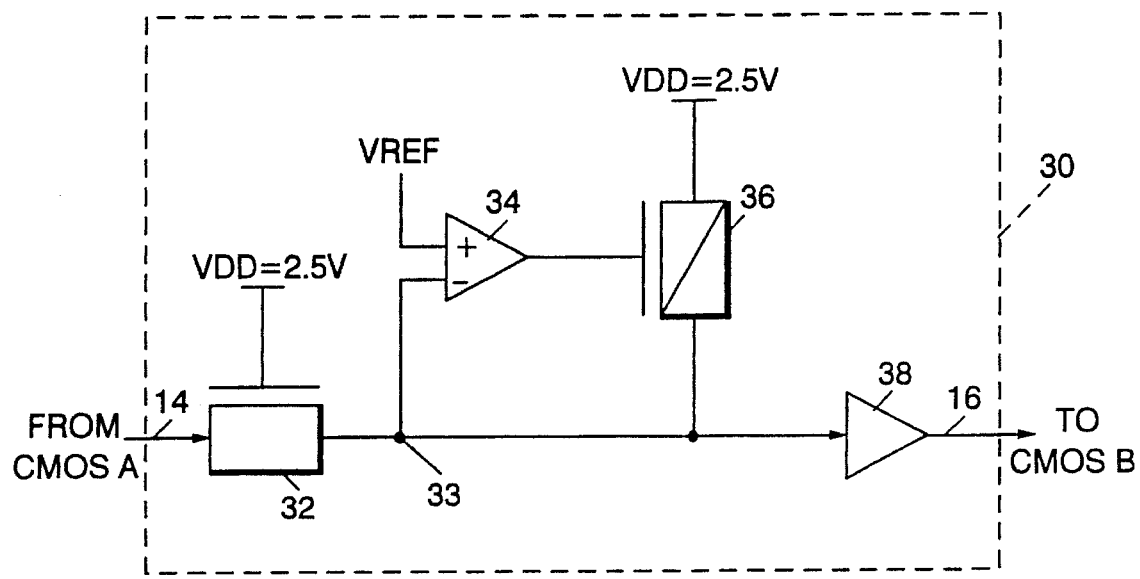
FIG. 3 illustrates a preferred embodiment of the present invention.

In the following description, numerous specific details are set forth such as specific voltages, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring first to FIG. 1, there is illustrated how a preferred embodiment of the present invention may be implemented within a multi-chip system, wherein two different CMOS technologies are utilized for implementing circuitry in a manner so that signals may be transferred from circuitry implemented within the first CMOS technology to circuitry implemented within the second different CMOS technology. FIG. 2 illustrates a single chip implementation of the system as illustrated in FIG. 1. Circuit 10 is implemented with CMOS A, while circuit 12 is implemented with CMOS B. In this example, CMOS A requires a power supply of 3.6 volts, while CMOS B requires a power supply of 2.5 volts. However, other CMOS technologies with other power supply requirements may be implemented in a similar manner as described herein.

Within the system illustrated in FIG. 1, it is required that one or more signals be transmitted from circuit 10 to circuit 12. To accomplish this task, circuit 30 is required to be placed between circuit 10 and circuit 12 in order that the signals transmitted along line 14 may be converted to an appropriate signal magnitude for transmission along line 16 to circuit 12.

Referring next to FIG. 3, there is illustrated a preferred embodiment of circuit 30. An incoming signal from circuit 10 arrives on line 14 and is received by the drain electrode of N-type device 32 (e.g., a field-effect transistor (FET)), which has a voltage supply of 2.5 volts coupled to its gate electrode. If the received signal is a "down" or "low" level, then the series transistor 32 passes the "down" level to the input of receiver 38 essentially unchanged and receiver 38 processes this signal to be outputted on line 16 to circuit 12 in FIG. 2. Device 32 also operates to provide isolation between the input and output signals.

If the received signal is an "up" or "high" level, which will be approximately 3.6 volts (since it is arriving from circuit 10 implementing the technology of CMOS A), then device 32 acts to limit the passing of the input signal to a value approximately equal to the gate voltage minus the threshold voltage of device 32 (2.5–0.8=1.7 volts) supplied to the input of receiver 38. However, as may be noticed by referencing FIG. 4, this value of 1.7 volts just meets the required up-level range required by the CMOS B technology implemented within circuit 12. This value of 1.7 volts provides no noise margin. In the worst case power condition, this problem can even become worse when the voltage at node 33 reduces to 1.45 volts (2.25v–0.8v=1.45v), which is lower than the VIH requirement as shown in FIG. 4.

To alleviate this problem, differential receiver 34 is coupled to the source electrode of device 32, and has its other input coupled to a reference voltage set at some convenient value, such as 1.25 volts so that the 1.7 volts outputted on the source electrode of device 32 exceeds this reference voltage level and causes differential receiver 34 to switch its output from VDD to approximately ground, causing P-type FET device 36 to turn on. This raises the input to receiver 38 to VDD (equal to 2.5 volts), thus producing a solid "1" electrical level to the inputs of receiver 38, which is well within the up-level range of the CMOS B circuitry in circuit 12.

Another feature of circuit 30 is that the P-type device 36 may be made sufficiently small in terms of its channel width to length ratio so that a received "0" level would not have any difficulty transferring a "down" level to the input of receiver 38.

Figure 5:
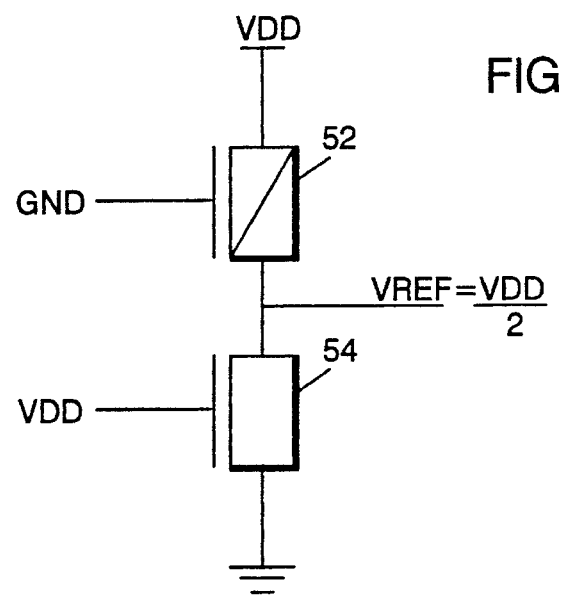
FIG. 5 illustrates a voltage reference circuit which may be utilized in conjunction with a preferred embodiment of the present invention.

Referring to FIG. 5, there is illustrated an alternative embodiment for supplying the reference voltage VREF to the input of differential receiver 34. The series combination of P-type device 52 and N-type device 54 with the gate inputs and power supply voltages illustrated produces a reference voltage equal to ½ of VDD. This illustrates that it is feasible to provide either an on-chip or off-chip voltage reference to the input of differential receiver 34.

Although the present invention and its advantages have been described in detail, it should be understood that various changes, substitutions and alterations can be made herein without departing from the spirit and scope of the invention as defined by the appended claims.

What is claimed is:

1. A circuit adaptable for facilitating communication of digital signals from circuitry implemented with a first CMOS technology requiring a first voltage level supply for operation to circuitry implemented with a second CMOS technology requiring a second voltage level supply for operation, said circuit comprising:

means adaptable for receiving from said circuitry implemented with said first CMOS technology requiring said first voltage level supply for operation a digital signal which has a first voltage level somewhere within a first range of voltage levels, wherein at least a portion of said first range of voltage levels lies outside a second range of voltage levels acceptable for input into said circuitry implemented with said second CMOS technology requiring said second voltage level supply for operation;

means adaptable for convening said first voltage level of said received digital signal, wherein said first voltage level lies somewhere within said first range of voltage levels, to a second voltage level which lies within said second range of voltage levels acceptable for input into said circuitry implemented with said second CMOS technology requiring said second voltage level supply for operation; and means adaptable for transmitting said second voltage level which lies within said second range of voltage levels acceptable for input into said circuitry implemented with said second CMOS technology requiring said second voltage level supply for operation from said means adaptable for convening said first voltage level to said second voltage level to said circuitry implemented with said second CMOS technology requiring said second voltage level supply for operation, wherein said means acceptable for converting said first voltage level of said received digital signal, wherein said first voltage level lies somewhere within said first range of voltage levels, to a second voltage level which lies within said second range of voltage levels acceptable for input into said circuitry implemented with said second CMOS technology requiring said second voltage level supply for operation further comprises;

a first FET having a drain electrode coupled to said means adaptable for receiving from said circuitry implemented with a first CMOS technology requiring a first voltage level supply for operation a digital signal which has a first voltage level somewhere within a first range of voltage levels, wherein a gate electrode of said first FET is coupled to a first voltage source, and wherein a source electrode of said first FET is coupled to said means adaptable for transmitting said second voltage level which lies within said second range of voltage levels acceptable for input into said circuitry, implemented with said second CMOS technology requiring said second voltage level supply for operation from said means adaptable for converting said first voltage level to said second voltage level to said circuitry implemented with said second CMOS technology requiring said second voltage level supply for operation;

a second FET having a source electrode coupled to a second voltage source and a drain electrode coupled to said means adaptable for transmitting said second voltage level which lies within said second range of voltage levels acceptable for input into said circuitry implemented with said second CMOS technology requiring said second voltage level supply for operation from said means adaptable for converting said first voltage level to said second voltage level to said circuitry implemented with said second CMOS technology requiring said second voltage level supply for operation; and a differential receiver having a first input coupled to said source electrode of said first FET and a second input coupled to a reference voltage, wherein an output of said differential receiver is coupled to a gate electrode of said second FET.

2. The circuit as recited in claim 1, wherein said first voltage level supply provides approximately 3.6 volts, and wherein said second voltage level supply provides approximately 2.5 volts, and wherein said second voltage source provides approximately 2.5 volts.

3. A method for converting a digital signal from a first voltage level to a second voltage level, said method comprising the steps of:

inputting said digital signal having a first voltage level into a drain electrode of a first FET device, wherein a gate electrode of said first FET device is coupled to a first reference voltage;

outputting from a source electrode of said first FET device a third voltage level of said digital signal;

comparing with a comparator said third voltage level of said digital signal to a second reference voltage;

if said third voltage level of said digital signal is greater than said second reference voltage, replacing said third voltage level of said digital signal with a voltage level of a third reference voltage by activating a second FET device coupled between said third reference voltage and said source electrode of said first FET device; and transmitting said voltage level of said third reference voltage as said digital signal.

* * * * *